United States Patent [19]
Otake et al.

[11] Patent Number: 5,805,422
[45] Date of Patent: Sep. 8, 1998

[54] SEMICONDUCTOR PACKAGE WITH FLEXIBLE BOARD AND METHOD OF FABRICATING THE SAME

[75] Inventors: Kenichi Otake; Manabu Bonkohara, both of Tokyo, Japan

[73] Assignee: NEC Corporation, Tokyo, Japan

[21] Appl. No.: 912,001

[22] Filed: Aug. 15, 1997

Related U.S. Application Data

[63] Continuation of Ser. No. 531,960, Sep. 21, 1995, abandoned.

[30] Foreign Application Priority Data

Sep. 21, 1994 [JP] Japan .................................. 6-226416

[51] Int. Cl.⁶ .............................. H05K 1/14; H05K 7/02; H01L 23/498
[52] U.S. Cl. .......................... 361/749; 257/737; 257/738; 257/778; 361/776; 361/783
[58] Field of Search .................................... 174/250, 254, 174/260, 261; 257/676, 684, 688, 692, 700, 701, 723, 724, 729, 730, 735, 736, 737, 738, 772, 773, 778, 780, 781, 787; 361/749, 776, 760, 783; 438/611, 623, 624, 625; 439/67, 77, 83

[56] References Cited

U.S. PATENT DOCUMENTS

| | | | |
|---|---|---|---|
| 3,427,715 | 2/1969 | Mika | 361/749 |
| 4,922,059 | 5/1990 | Walker et al. | 361/749 |
| 5,148,265 | 9/1992 | Khandros et al. | 257/784 |
| 5,148,266 | 9/1992 | Khandros et al. | 257/784 |
| 5,229,916 | 7/1993 | Frankeny et al. | 361/320 |
| 5,394,303 | 2/1995 | Yamaji | 361/749 |

FOREIGN PATENT DOCUMENTS

| | | | |
|---|---|---|---|
| 62-260343 | 11/1987 | Japan | 257/787 |
| 1-283986 | 11/1989 | Japan | 439/65 |
| WO92/05582 | 4/1992 | WIPO | 257/784 |

*Primary Examiner*—Donald Sparks
*Attorney, Agent, or Firm*—Sughrue, Mion, Zinn, Macpeak & Seas, PLLC

[57] ABSTRACT

Solder balls are attached to a flexible printed-circuit board which is shaped so as to be able to cover at least an upper surface, a side surface, and a lower surface of an IC chip, and the flexible printed-circuit board is placed on the IC chip. Then, the flexible printed-circuit board is folded over edges of the IC chip, and bonded to outer surfaces of the IC chip by an adhesive sheet. Thereafter, a sealing resin is poured into a gap between the upper surface of the IC chip and the flexible printed-circuit board, and cured, thereby completing a semiconductor package.

10 Claims, 5 Drawing Sheets

SEMICONDUCTOR PACKAGE WITH FLEXIBLE BOARD AND METHOD OF FABRICATING THE SAME

This is a Continuation of application Ser. No. 08/531,960 filed Sep. 21, 1995 abandoned.

BACKGROUND OF THE INVENTION

1. Field of the Invention

The present invention relates to a semiconductor package and a method of assembling such as a semiconductor package.

2. Description of the Related Art

Figure 1:
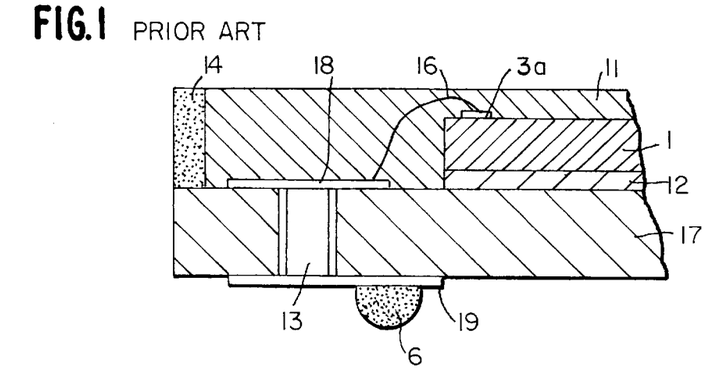
FIG. 1 is a fragmentary sectional side elevational view of a conventional semiconductor package.

One conventional semiconductor package shown in FIG. 1 of the accompanying drawings is assembled by die-attaching an IC chip 1 to the upper surface of a substrate 17 with an adhesive paste 12, electrically connecting an electrode pad 3a on the IC chip 1 to a pad 18 on the substrate 17 with wires 16 according to wire bonding, fixing a stop frame 14 on the upper surface of a peripheral edge of the substrate 17, and then filling the space inside the stop frame 14 with a sealing resin 11 that will subsequently be hardened. Solder balls 6 are attached to a pad 19 on the lower surface of the substrate 17 for connection to a mother-board (MB). The pads 18, 19 are electrically connected to each other through holes 13. For more details, reference should be made to U.S. Pat. No. 5,241,133.

Figure 2:
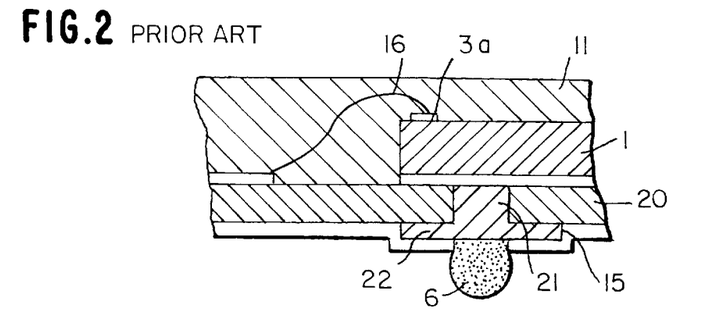
FIG. 2 is a fragmentary sectional side elevational view of another conventional semiconductor package.

FIG. 2 of the accompanying drawings shows another conventional semiconductor package. As shown in FIG. 2, a via 21 is disposed in a substrate 20 directly below an IC chip 1 on the substrate 20, and a solder ball 6 is attached to a pad 22 directly below the via 21. For further details, reference should be made to U.S. Pat. No. 5,216,278.

Still another conventional semiconductor package disclosed in Japanese laid-open patent publication No. 4-32253 includes an IC chip and a package substrate which are connected to each other by a solder bump, and the IC chip is hermetically sealed by the package and a cap. The cap has in inner surface soldered to an upper surface of the IC chip, and a peripheral edge bonded to the package substrate.

Figure 3:
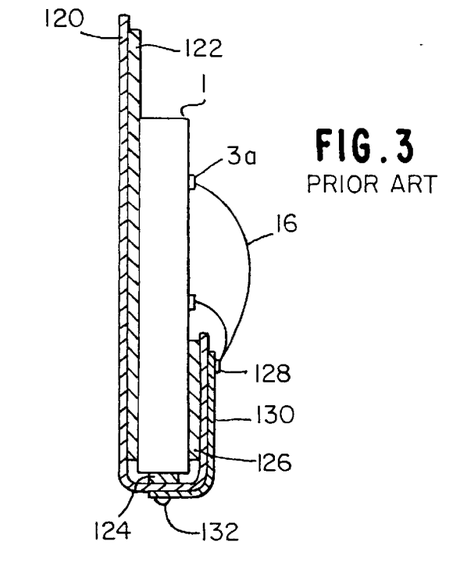
FIG. 3 is a sectional side elevational view of still another conventional semiconductor package.
Figure 4:
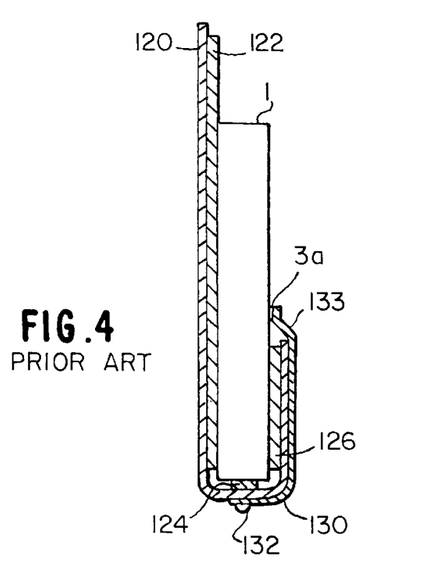
FIG. 4 is a sectional side elevational view of yet still another conventional semiconductor package.
Figure 5:
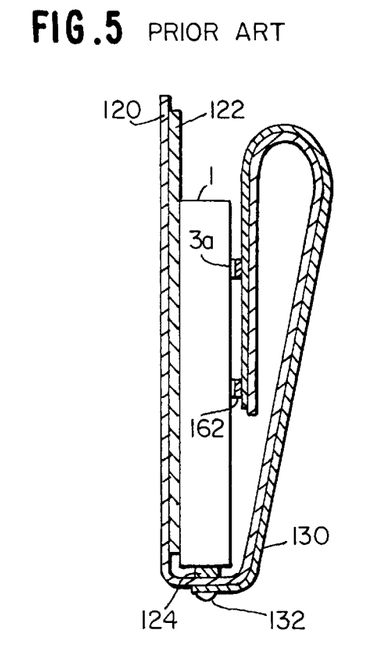
FIG. 5 is a sectional side elevational view of a further conventional semiconductor package.

U.S. Pat. No. 5,229,916 shows semiconductor packages having flexible printed-circuit (FPC) boards 120 as illustrated in FIGS. 3 through 5 of the accompanying drawings. As shown in FIGS. 3 through 5, each of the FPC boards 120 has a portion which is bent over along surfaces of an IC chip 1. In the semiconductor package shown in FIG. 3, the FPC board 120 has a bent configuration extending along face, side, and back surfaces of the IC chip 1. Plates 126, 124 are bonded to the face and side surfaces of the IC chip 1, and a heat-radiating plate 122 is bonded to the back surface of the IC chip 1. The FPC board 120 is bonded to these plates 126, 124, 122. A pad 3a on the IC chip 1 is connected to a pad 128 on the FPC board 120 by a wire 16, and bumps 132 mounted on the FPC board 120 remotely from the plate 124 are connected to the pad 128 by interconnections 130 on the FPC board 120. The semiconductor package shown in FIG. 3 is vertically mounted on a MB, and connected to a pad on the MB by the bump 132.

In the semiconductor package shown in FIG. 4, a lead 133 extending from an interconnection on the FPC board 120 is fixed to a pad 3a on the IC chip 1 by the technique of TAB. In the semiconductor package shown in FIG. 5, the FPC board 120 is connected to the face surface of the IC chip 1 by bumps 162, and then folded back and bonded to the plates 124, 122 on the side and back surfaces of the IC chip 1.

The conventional semiconductor packages shown in FIGS. 1 and 2 are disadvantageous in that since the pad 18 and the through holes 13 are disposed around the IC chips 1 on the package substrates 17, 20, the surface area of the package substrates 17, 20 is larger than that of the IC chips 1, therefore the semiconductor packages require a large area for mount on the MBs. Furthermore, the stop frame 14 for stopping the sealing resin 11 as it is poured onto the package substrates 17, 20 results in an increase in the cost of materials used and the number of steps of assembling the semiconductor packages.

When the poured sealing resin 11 is hardened for curing, the package substrates 17, 20 tend to bend due to the difference between the thermal expansion coefficient of the package substrates 17, 20 and the sealing resin 11. Therefore, when the semiconductor packages are mounted on respective MBs, some of the solder balls 6 are not held in touch with pads on the MBs, resulting in an opening failure.

The semiconductor packages disclosed in U.S. Pat. No. 5,229,916 require a relatively small area for mount on MBs. However, they also have a problem in that because the area of the FPC board 120 extending over the side surface of the IC chip 1 is small, it is not possible to provide many bumps 132 on that area of the FPC board 120 as terminals for external connection.

SUMMARY OF THE INVENTION

It is therefore an object of the present invention to provide a semiconductor package which requires a reduced area for mount on an MB and has an increased number of terminals for external connection.

Another object of the present invention is to provide a method of assembling such a semiconductor package.

According to the present invention, there is provided a semiconductor package comprising a semiconductor chip having a first pad disposed on an upper surface thereof, a flexible printed-circuit board folded over along an edge of the semiconductor chip in covering relation to at least the upper surface, a side surface, and a lower surface of the semiconductor chip, the flexible printed-circuit board being bonded to at least the lower surface of the semiconductor chip and having a second pad disposed on a portion thereof covering the upper surface of the semiconductor chip and electrically connected to the first pad and a third pad disposed on an outer surface of a portion thereof covering the lower surface of the semiconductor chip and electrically connected to the second pad, and a third bump mounted on the third pad.

The second pad may be disposed on an inner surface of the flexible printed-circuit board, and the semiconductor package may further comprise a first bump mounted on the first pad and connected to the second pad, and a sealing resin filled in a gap between the upper surface of the semiconductor chip and the flexible printed-circuit board.

Alternatively, the second pad may be disposed on an outer surface of the flexible printed-circuit board, the flexible printed-circuit board having a hole defined therein corresponding to the first pad, the first pad and the second pad being connected by a bonding wire.

The semiconductor package may further comprise a fourth pad for connection to an external circuit, the fourth pad being disposed on an outer surface of the portion of the flexible printed-circuit board covering the upper surface of the semiconductor chip.

The flexible printed-circuit board may be disposed in covering relation to substantially all outer surfaces of the semiconductor chip.

According to the present invention, there is also provided a method of assembling a semiconductor package, comprising the steps of providing a flexible printed-circuit board which can be folded over along an edge of a semiconductor chip in covering relation to at least an upper surface, a side surface, and a lower surface of the semiconductor chip, the flexible printed-circuit board having a second pad disposed on an inner surface of a portion thereof covering the upper surface of the semiconductor chip for electric connection to a first pad on the upper surface of the semiconductor chip and a third pad disposed on an outer surface of a portion thereof covering the lower surface of the semiconductor chip and electrically connected to the second pad, placing the portion of the flexible printed-circuit board which covers the upper surface of the semiconductor chip on the upper surface of the semiconductor chip in alignment therewith, connecting the second pad on the flexible printed-circuit board to the first pad on the upper surface of the semiconductor chip through a bump, folding the flexible printed-circuit board over the edge of the semiconductor chip in covering relation to at least the upper surface, the side surface, and the lower surface of the semiconductor chip, bonding the flexible printed-circuit board to at least the lower surface of the semiconductor chip, pouring a sealing resin into a gap between the flexible printed-circuit board and the upper surface of the semiconductor chip, and hardening the sealing resin which has been poured into the gap.

According to the present invention, there is further provided a method of assembling a semiconductor package, comprising the steps of providing a flexible printed-circuit board which can be folded over along an edge of a semiconductor chip in covering relation to at least an upper surface, a side surface, and a lower surface of the semiconductor chip, the flexible printed-circuit board having a hole defined in a portion thereof covering the upper surface of the semiconductor chip at a position corresponding to a first pad on the semiconductor chip, a second pad disposed on an outer surface of a portion thereof covering the upper surface of the semiconductor chip, and a third pad disposed on an outer surface of a portion thereof covering the lower surface of the semiconductor chip and electrically connected to the second pad, placing the portion of the flexible printed-circuit board which covers the upper surface of the semiconductor chip on the upper surface of the semiconductor chip in alignment therewith, folding the flexible printed-circuit board over the edge of the semiconductor chip in covering relation to at least the upper surface, the side surface, and the lower surface of the semiconductor chip, bonding the flexible printed-circuit board to at least the lower surface of the semiconductor chip, and connecting the first pad which is exposed through the hole in the flexible printed-circuit board to the second pad through a bonding wire.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Like or corresponding parts are denoted by like or corresponding reference numerals throughout views.

Figure 6:
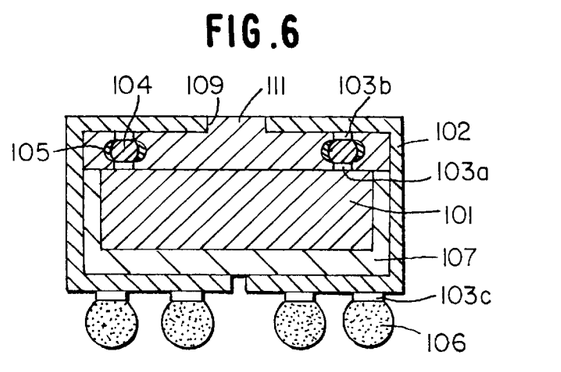
FIG. 6 is a cross-sectional view of a semiconductor package according to an embodiment of the present invention.

As shown in FIG. 6, a semiconductor package according to an embodiment of the present invention has an IC chip 101 with a plurality of first bumps 104 mounted thereby by respective first pads 103a disposed on an upper surface of the IC chip 101. The surfaces of the first bumps 104 are covered with a conductive material 105. The semiconductor substrate also has an FPC board 102 disposed in surrounding relation to the IC chip 101.

Figure 8:
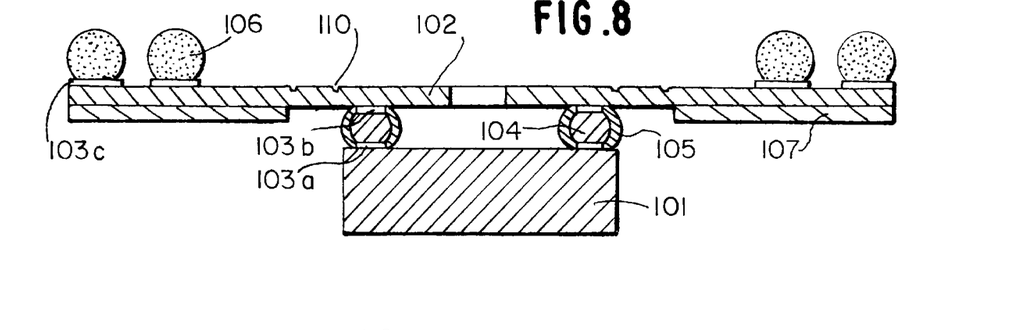
FIG. 8 is a cross-sectional view of the FPC board attached to an upper surface of an IC chip, the view being illustrative of a method of fabricating the semiconductor package shown in FIG. 6.

A process of assembling the IC chip 101 and the FPC board 102 will be described below with reference to FIG. 8. As shown in FIG. 8, the FPC board 102 which is unfolded is placed over the IC chip 101 in central alignment therewith, and then pressed against the IC chip 101 with heat, connecting a plurality of second pads 103b on the FPC board 102 to the respective first bumps 104. Then, the FPC board 102 is folded to cover upper, side, and lower surfaces of the IC chip 101, and bonded thereto by an adhesive sheet 107.

Figure 7:
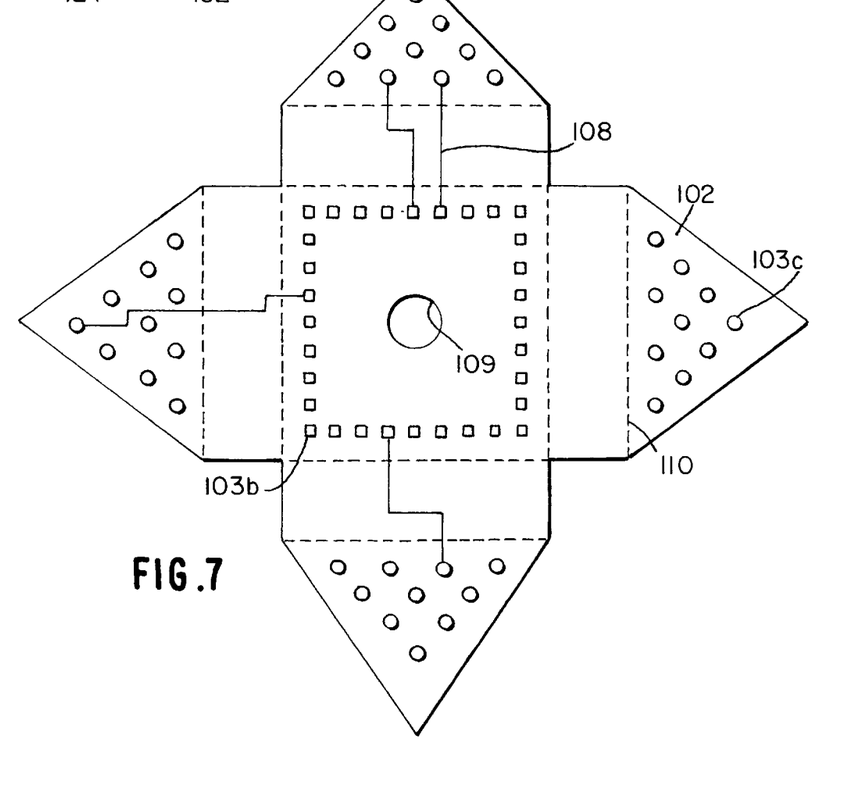
FIG. 7 is a plan view of an FPC board, shown as unfolded, of the semiconductor package shown in FIG. 6.

The FPC board 12 has a thickness of about 50 μm and is made of polyimide or polyester. As shown in FIG. 7, the FPC board 102, before it is folded, comprises a central square portion corresponding to the upper surface of the IC chip 101, four rectangular portions joined respectively to respective four sides of the central square portion and corresponding to respective four sides of the IC chip 101, and four triangular portions joined respectively to the four rectangular portions and corresponding to respective four triangular regions of the lower surface of IC chip 101 that are divided by diagonal lines. When the FPC board 102 is folded around the IC chip 101, it can cover substantially the entire outer surfaces of the IC chip 101. The FPC board 102 is folded along grooves 110, indicated by the broken lines in FIG. 7, defined in its outer surface which is exposed outwardly when the FPC board 102 is folded. If the thickness of the FPC board 102 is 50 $\mu$m, then each of the grooves 110 has a width ranging from 5 to 10 $\mu$m, and the grooves 110 may be formed by melting the surface of the FPC board 102 with a laser beam or pressing a die against the surface of the FPC board 102. Alternatively, the grooves 110 may be defined in both outer and inner surfaces thereof. The adhesive sheet 107 is attached, in advance, to the entire inner surface of the FPC board 102 except for its portion corresponding to the upper surface of the IC chip 101. The adhesive sheet 107 is of such a property that it will be set in a subsequent curing step.

As shown in FIG. 8, the second pads 103b are attached, in advance, to the portion of the inner surface of the FPC board 102 which corresponds to the upper surface of the IC chip 101. As shown in FIG. 6, a plurality of third pads 103c are attached to the portion of the outer surface of the FPC board 102 which corresponds to the lower surface of the IC chip 101. Corresponding pairs of the second pads 103b and the third pads 103c are connected by interconnection patterns 108 and through holes (not shown). Third bumps 106 which comprise solder balls are mounted on the third pads 103c, respectively, for connection to an MB. Therefore, the bottom surface of the semiconductor package composed of the IC chip 101 and the FPC board 102 covering the IC chip 101 supports thereon the third bumps 106 that are electrically connected to the first pads 103a on the IC chip 101.

The third bumps 106 are formed on the FPC board 102 as follows: First, a cream solder paste of eutectic crystal of Sn/Pb is coated on each of the third pads 103c using a metal mask having a thickness of 150 $\mu$m. Then, the solder paste is melted during reflow at a maximum temperature of 230° C., producing solder balls as the third bumps 106 on the respective third pads 103c. If the solder balls are to have an increased height, a solder composed of Sn and Pb at a ratio of 9/1 and meltable at a high temperature is used instead of the cream solder paste of eutectic crystal of Sn/Pb. Alternatively, highly conductive metal balls of Al, Cu or the like which are highly resistant to solders are plated with a solder of eutectic crystal of Sn/Pb, and attached respectively to the third pads 103c. In this case, the third pads 103c are coated with a flux in advance, and the solder-plated balls are attached to the third pads 103c by virtue of the viscosity of the flux and then melted with heat. The third pads 103c each have a diameter ranging from 0.5 to 1.5 mm, and are spaced at standard pitches or intervals of 1 mm, 1.27 mm, and 1.5 mm. The solder balls each have a diameter ranging from 0.5 to 1.5 mm. After the semiconductor package is mounted on an MB, the solder balls are compressed and deformed. If the solder balls are in the form of metal balls plated with a solder of eutectic crystal of Sn/Pb, then they are deformed to a smaller degree than the solder balls that are formed of a solder paste.

The first bumps 104 on the first pads 103a are made of Au, Cu, or a solder. If the first bumps 104 are made of Au, then the conductive material 105 covering the first bumps 104 comprises an Ag paste or a solder paste composed of Sn and Ag at a ratio of 96.5/3.5. If the first bumps 104 are made of Cu, then the conductive material 105 comprises a solder of eutectic crystal of Sn/Pb or a solder of Sn/Ag. If the first bumps 104 are made of a solder, then the first bumps 104 are not covered with the conductive material 105.

After the IC chip 101 has been enclosed by the FPC board 102, an epoxy or silicon resin 111 is introduced into the hole 109 defined in the FPC board 102 and poured into the gap between the upper surface of the IC chip 101 and the FPC board 102, and then cured. If the epoxy resin 111 is used, it is cured at a temperature ranging from 120° C. to 150° C. for about two hours, and if the silicon resin 111 is used, it is cured at a temperature of about 120° C. for one hour.

Figures 9, 10, 11:
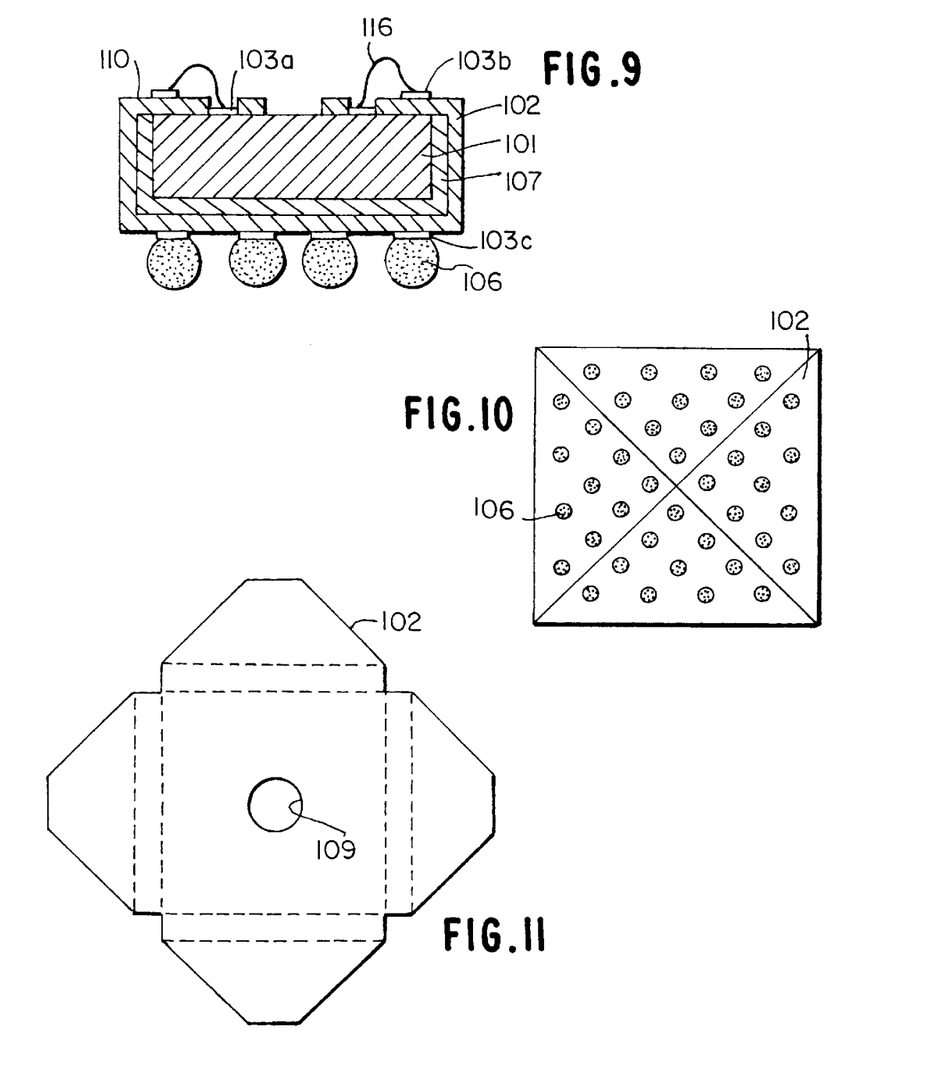
FIG. 9 is a cross-sectional view of a semiconductor package according to another embodiment of the present invention.
FIG. 10 is a bottom view of the semiconductor package shown in FIG. 6.
FIG. 11 is a plan view of an FPC board, shown as unfolded, of a semiconductor package according to still another embodiment of the present invention.

As shown in FIG. 9 which shows a semiconductor package according to another embodiment, the IC chip 101 and the FPC board 102 may be electrically connected to each other by wires 116 instead of the first bumps 104. In the embodiment shown in FIG. 9, the FPC board 102 has holes defined therein corresponding to the respective first pad, 103a on the IC chip 101, and the IC chip 101 and the FPC board 102 are bonded to each other by the adhesive sheet 107. The second pads 103b are mounted on the outer surface of the FPC board 102, and connected to the first pads 103a on the IC chip 101 by the wires 116 of Au or Al by the method of wire bonding.

FIG. 11 shows an FPC board 101, shown as unfolded, of a semiconductor package according to still another embodiment of the present invention. The pads 103b, 103c are omitted from illustration in FIG. 11.

Figure 12:
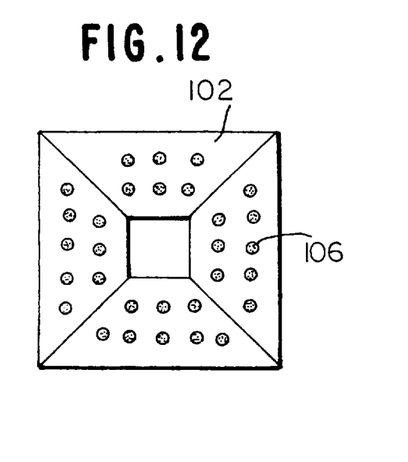
FIG. 12 is a bottom view of the semiconductor package shown in FIG. 11.

The FPC board 102 shown in FIG. 11 is similar to the FPC board 102 shown in FIG. 7 except that the four triangular portions corresponding to respective four triangular regions of the lower surface of IC chip 101 that are divided by diagonal lines have their vertexes cut off. When the FPC board 102 is folded, these cut-off vertexes define a square hole located centrally in the bottom of the FFC board 102 as shown in FIG. 12. When the semiconductor package is installed on an MB, an adhesive is introduced into the square hole in the bottom of the FPC board 102 to join the semiconductor package and the MB to each other with increased strength.

Figure 13:
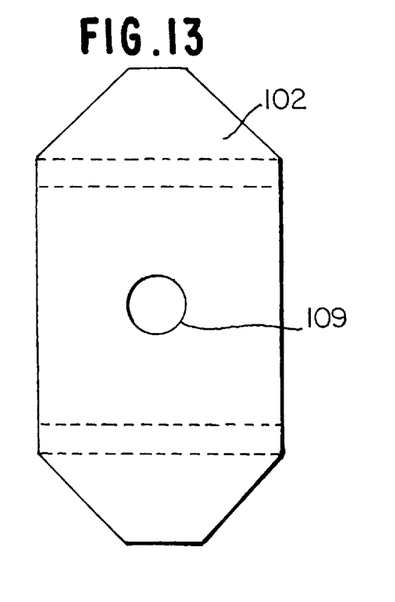
FIG. 13 is a plan view of an FPC board, shown as unfolded, of a semiconductor package according to yet still another embodiment of the present invention.

FIG. 13 illustrates an FPC board 102, shown as unfolded, of a semiconductor package according to yet still another embodiment of the present invention. The FPC board 102 shown in FIG. 13 comprises a central square portion corresponding to the upper surface of the IC chip, two rectangular portions joined respectively to respective two opposite sides of the central square portion and corresponding to respective two opposite sides of the IC chip, and two triangular portions joined respectively to the two opposite rectangular portions and corresponding to respective two opposite triangular regions of the lower surface of IC chip that are divided by diagonal lines, the triangular portions having their respective vertexes cut off.

Figure 14:
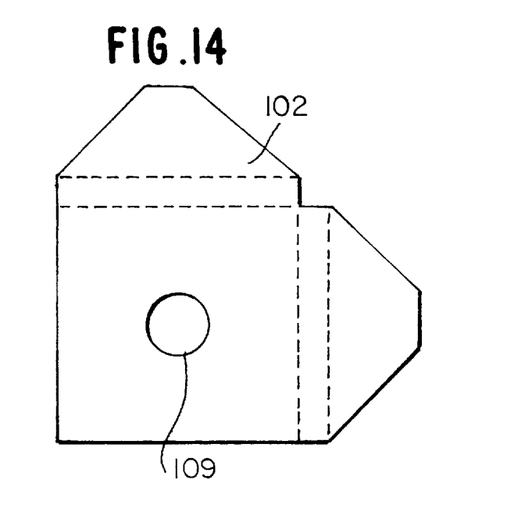
FIG. 14 plan view of an FPC board, shown as unfolded, of a semiconductor package according to a further embodiment of the present invention.

FIG. 14 shows an FPC board 102, shown as unfolded, of a semiconductor package according to a further embodiment of the present invention. The FPC board 102 shown in FIG. 14 comprises a central square portion corresponding to the upper surface of the IC chip, two rectangular portions joined respectively to respective two adjacent sides of the central square portion and corresponding to respective two adjacent sides of the IC chip, and two triangular portions joined respectively to the two adjacent rectangular portions and corresponding to respective two adjacent triangular regions of the lower surface of IC chip that are divided by diagonal lines, the triangular portions having their respective vertexes cut off.

Figure 15:
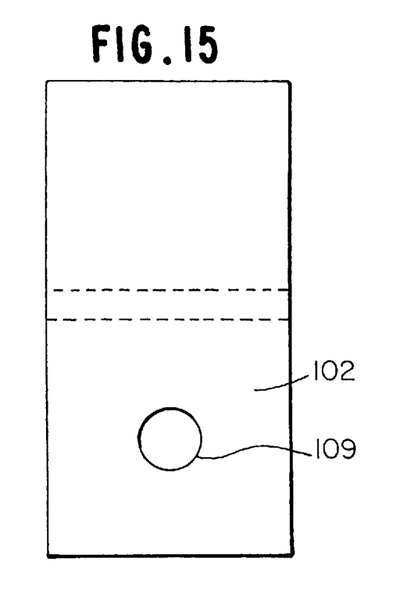
FIG. 15 is plan view of an FPC board, shown as unfolded, of a semiconductor package according to a still further embodiment of the present invention.

FIG. 15 shows an FPC board 102, shown as unfolded, of a semiconductor package according to a still further embodiment of the present invention. The FPC board 102 shown in FIG. 15 comprises a central square portion corresponding to the upper surface of the IC chip, a rectangular portion joined to a side of the central square portion and corresponding to a side of the IC chip, and a square portion joined to the rectangular portion and corresponding to the lower surface of IC chip.

Since the FPC boards 102 shown in FIGS. 11 through 15 are part of the FPC board 102 shown in FIG. 7, they allow the semiconductor packages to be assembled in a reduced number of steps at a reduced cost of materials.

Figure 16:
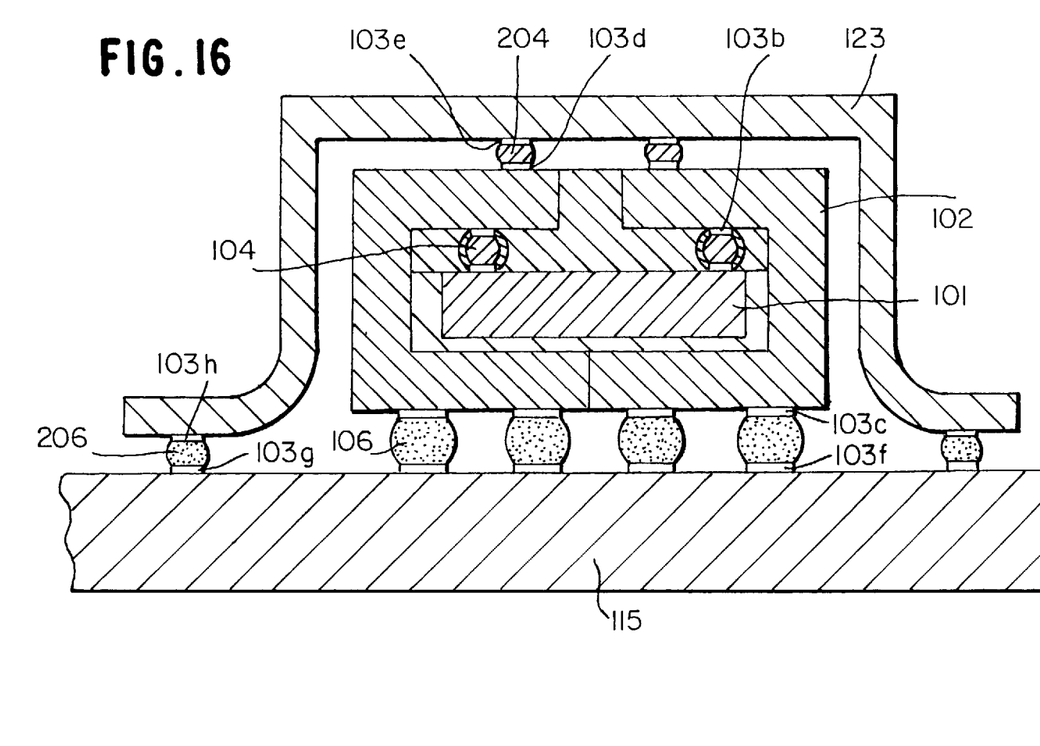
FIG. 16 is a cross-sectional view of a semiconductor package according to a yet still further embodiment of the present invention, the semiconductor package being mounted on an MB.

FIG. 16 illustrates a semiconductor package according to a still further embodiment of the present invention, the semiconductor package being mounted on an MB 115.

In FIG. 16, the semiconductor package includes, in addition to the components shown in FIG. 6, a plurality of fourth pads 103d mounted on the upper surface of an FPC board 102 for connection to external circuits and a plurality of fourth bumps 204 mounted respectively on the fourth pads 103d. The second pads 103b and the third pads 103c or the fourth pads 103d corresponding thereto are connected by interconnections on the FPC 102 and through holes. The semiconductor package with the IC chip 101 is mounted on the MB 115 by the third bumps 106 which are melted and connected to respective pads 103f on the MB 115. An FPC board 123 is disposed in covering relation to the semiconductor package mounted on the MB 115, a plurality of pads 103e on the FPC board 123 are melted and connected to the bumps 204 on the fourth pads 103d, and bumps 206 on respective pads 103g on the MB 115 are melted and connected to respective pads 103h on the FPC board 123. The pads 103e and the pads 103h corresponding thereto are connected by interconnections on the FPC board 123. In the embodiment shown in FIG. 16, the fourth pads 103d are employed in addition to the third pads 103c to provide more terminals for external connection than with the embodiment shown in FIG. 6. According to a modification, the FPC board 123, the bumps 204 on the fourth pads 103d, and the bumps 206 on the pads 103g may be dispensed with, and the pads 103d and the pads 103g may be connected by bonding wires.

With the arrangement of the present invention, as described above, the FPC board electrically connected to the semiconductor chip is folded and bonded to the outer surface of the semiconductor chip. Therefore, the semiconductor package remains substantially as large as the semiconductor chip, and hence requires a smaller area for installation on an MB than semiconductor packages in which semiconductor chips are mounted on boards and sealed by a sealing resin or a sealing cap.

Since the bumps which are provided on the lower surface of the semiconductor package as terminals for external connection can be positioned in a two-dimensional pattern, ratter than a linear pattern, the semiconductor package may have more terminals for external connection than the semiconductor packages disclosed in U.S. Pat. No. 5,299,916.

The semiconductor package according to the present invention is relatively inexpensive to fabricate because no stop frame is required to stop a sealing resin when it is poured into the semiconductor package and hence the cost of materials and the number of fabricating steps may be reduced.

Since the transverse and longitudinal lengths of the semiconductor package are small as compared with the thickness thereof, any bend of the semiconductor package after the sealing resin has been cured is minimized, eliminating an opening failure of pads on an MB at the time the semiconductor package is installed on the MB.

Although certain preferred embodiments of the present invention have been shown and described in detail, it should be understood that various changes and modifications may be made therein without departing from the scope of the appended claims.

What is claimed is:

1. A semiconductor package comprising:
   a semiconductor chip having a first pad disposed on an upper surface of said semiconductor chip;
   a flexible printed-circuit board folded along grooves and over an edge of said semiconductor chip in covering relation to at least the upper surface, a side surface, and a lower surface of the semiconductor chip, said flexible printed-circuit board being bonded to at least the lower surface of said semiconductor chip and having a second pad disposed on an inner surface of said flexible printed-circuit board covering the upper surface of said semiconductor chip and electrically connected to said first pad and a third pad disposed on an a outer surface of a portion of said flexible printed-circuit board covering the lower surface of said semiconductor chip and electrically connected to said second pad; a first bump mounted on said first pad and connected to said second pad:
   a third bump mounted on said third pad;
   a sealing resin filled in a gap between the upper surface of said semiconductor chip and said flexible printed-circuit board.

2. A semiconductor package according to claim 1, wherein said flexible printed-circuit board is disposed in covering relation to substantially all outer surfaces of said semiconductor chip.

3. A semiconductor package according to claim 1, wherein said second pad is disposed on an outer surface of said flexible printed-circuit board, said flexible printed-circuit board having a hole defined therein corresponding to said first pad, said first pad and said second pad being connected by a bonding wire.

4. A semiconductor package according to claim 3, wherein said flexible printed-circuit board is disposed in covering relation to substantially all outer surfaces of said semiconductor chip.

5. A semiconductor package according to claim 3, further comprising a fourth pad for connection to an external circuit, said fourth pad being disposed on an outer surface of the portion of said flexible printed-circuit board covering the upper surface of said semiconductor chip.

6. A semiconductor package according to claim 1, further comprising an adhesive sheet to bond said flexible printed-circuit board to at least the lower surface of said semiconductor chip.

7. A method of assembling a semiconductor package, comprising the steps of:
   providing a flexible printed-circuit board which can be folded along grooves and over an edge of a semiconductor chip in covering relation to at least an upper surface, a side surface, and a lower surface of the semiconductor chip, said flexible printed-circuit board having a second pad disposed on an inner surface of a portion of said flexible printed-circuit board covering the upper surface of said semiconductor chip for electric connection to a first pad on the upper surface of the semiconductor chip and a third pad disposed on an outer surface of a portion of said flexible printed-circuit board covering the lower surface of said semiconductor chip and electrically connected to said second pad;

placing the portion of said flexible printed-circuit board which covers the upper surface of said semiconductor chip on the upper surface of said semiconductor chip in alignment therewith;

connecting the second pad on said flexible printed-circuit board to the first pad on the upper surface of the semiconductor chip through a bump;

folding said flexible printed-circuit board along said grooves and over the edge of said semiconductor chip in covering relation to at least the upper surface, the side surface, and the lower surface of the semiconductor chip;

bonding said flexible printed-circuit board to at least the lower surface of the semiconductor chip;

introducing a sealing resin into a gap between said flexible printed-circuit board and the upper surface of said semiconductor chip; and hardening the sealing resin which has been introduced into the gap.

8. A method of assembling a semiconductor package according to claim 7, wherein the method step of bonding said flexible printed-circuit board to at least the lower surface of the semiconductor chip uses an adhesive sheet.

9. A method of assembling a semiconductor package, comprising the steps of:

providing a flexible printed-circuit board which can be folded along grooves and over an edge of a semiconductor chip in covering relation to at least an upper surface, a side surface, and a lower surface of the semiconductor chip, said flexible printed-circuit board having a hole defined in a portion of said flexible printed-circuit board covering the upper surface of the semiconductor chip at a position corresponding to a first pad on the semiconductor chip, a second pad disposed on an outer surface of a portion of said flexible printed-circuit board covering the upper surface of said semiconductor chip, and a third pad disposed on an outer surface of a portion of said flexible printed-circuit board covering the lower surface of said semiconductor chip and electrically connected to said second pad;

placing the portion of said flexible printed-circuit board which covers the upper surface of said semiconductor chip on the upper surface of said semiconductor chip in alignment therewith;

folding said flexible printed-circuit board along said grooves and over the edge of said semiconductor chip in covering relation to at least the upper surface, the side surface, and the lower surface of the semiconductor chip;

bonding said flexible printed-circuit board to at least the lower surface of the semiconductor chip;

connecting said first pad which is exposed through said hole in the flexible printed-circuit board to said second pad through a bonding wire; and introducing a sealing resin into a gap between said flexible printed-circuit board and the upper surface of said semiconductor chip.

10. A method of assembling an semiconductor package according to claim 9, wherein the method step of bonding said flexible printed-circuit board to at least the lower surface of the semiconductor chip uses an adhesive sheet.

* * * * *